Figure 1:
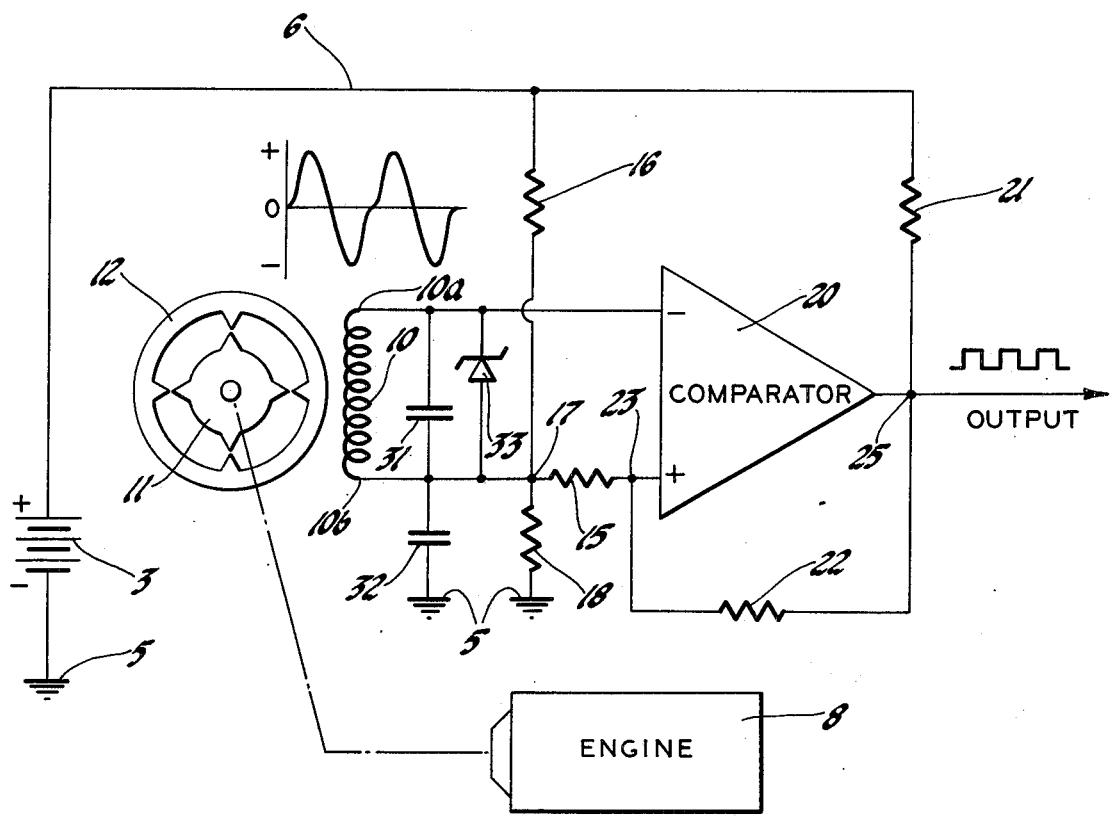

United States Patent [19]

Boyer

[11] 4,153,850
[45] May 8, 1979

[54] CIRCUIT FOR PRODUCING A SERIES OF SUBSTANTIALLY SQUARE WAVE OUTPUT SIGNALS

[75] Inventor: James A. Boyer, Anderson, Ind.

[73] Assignee: General Motors Corporation, Detroit, Mich.

[21] Appl. No.: 807,557

[22] Filed: Jun. 17, 1977

[51] Int. Cl.² .............................................. H03K 5/20
[52] U.S. Cl. .................................. 307/354; 307/357; 123/148 E
[58] Field of Search ................... 307/354, 357; 328/31; 310/70 R; 128/148 E

[56] References Cited
U.S. PATENT DOCUMENTS

| | | | |
|---|---|---|---|
| 3,666,970 | 5/1972 | Abbott et al. | 307/359 |
| 3,801,830 | 4/1974 | Boyer | 307/354 |
| 3,991,733 | 11/1976 | Harris | 307/354 |

Primary Examiner—Andrew J. James
Assistant Examiner—B. P. Davis
Attorney, Agent, or Firm—Richard G. Stahr

[57] ABSTRACT

A source of alternating current signals is applied across the inverting and non-inverting input terminals of a voltage comparator circuit through a series bias resistor. Electrical circuitry including a supply potential source and the comparator circuit output terminal is effective to direct current flow through the bias resistor in respective first and second opposite directions while the comparator circuit is in the first and in the second operating conditions whereby the polarity of the potential generated across the bias resistor reverses with each change of operating condition of the comparator circuit.

3 Claims, 2 Drawing Figures

CIRCUIT FOR PRODUCING A SERIES OF SUBSTANTIALLY SQUARE WAVE OUTPUT SIGNALS

The subject invention is directed to a circuit for producing a series of substantially square wave output signals and, more specifically, to a circuit for producing a series of substantially square wave output signals having the edges thereof synchronized with the polarity transitions of a series of alternating current input signals.

It has been found that with certain magnetic pickup applications wherein the terminal ends of the pickup coil are connected across the input terminals of a voltage comparator circuit, spurious signals induced in the magnetic pickup coil by stray magnetic fields may be of a polarity opposite that of the alternating current input signal cycle and of a magnitude great enough to switch the comparator circuit to the other condition of operation. With digital processing applications, this spurious triggering of the comparator circuit to the other condition of operation is intolerable in that false signals are introduced into the digital data processing system, a condition which results in error.

To inhibit the spurious triggering of the voltage comparator circuit to the other operating condition in response to spurious signals which may be induced in the magnetic pickup coil, an additional bias potential in series aiding relationship with each half cycle of the alternating current input signal to provide a higher comparator circuit hysteresis level may be provided. This bias potential, therefore, raises the comparator circuit switching threshhold level to a value which will reject most spurious and unwanted noise signals which may be induced in the pickup coil.

It is, therefore, an object of this invention to provide an improved circuit for producing a series of substantially square wave output signals.

It is another object of this invention to provide an improved circuit for producing a series of substantially square wave output signals having the edges thereof synchronized with the polarity transitions of a series of alternating current input signals.

It is a further object of this invention to provide an improved circuit for producing a series of substantially square wave output signals wherein a bias potential in series aiding relationship with each half cycle of a series of alternating current input signals is generated during each half cycle of the alternating current input signals.

It is a further object of this invention to provide an improved circuit for producing a series of substantially square wave output signals wherein circuitry is connected in electrical circuit with a supply potential source, a bias resistor and a comparator circuit output terminal in such a manner that current flow is directed through the bias resistor in respective first and second opposite directions while the comparator circuit is in the first and in the second operating condition, respectively, whereby the polarity of the bias potential generated across the bias resistor reverses with each change of operating condition of the comparator circuit.

In accordance with this invention, a circuit for producing a series of substantially square wave output signals having the edges thereof synchronized with the polarity transitions of a series of alternating current input signals is provided wherein the series of alternating current input signals is applied across the input terminals of a comparator circuit to trigger this device between first and second operating conditions in response to each reversal of polarity of the series of alternating current input signals and circuitry connected in electrical circuit relationship with a supply potential source, the comparator circuit output terminal and a bias resistor connected in series with the series of alternating current input signals is effective to direct current flow through the bias resistor in respective first and second opposite directions while the comparator circuit is in the first and in the second operating conditions whereby the bias potential developed across the bias resistor reverses in polarity with each change of operating condition of the comparator circuit and is in series aiding relationship with each half cycle of the series of alternating current input signals.

Figure 2:
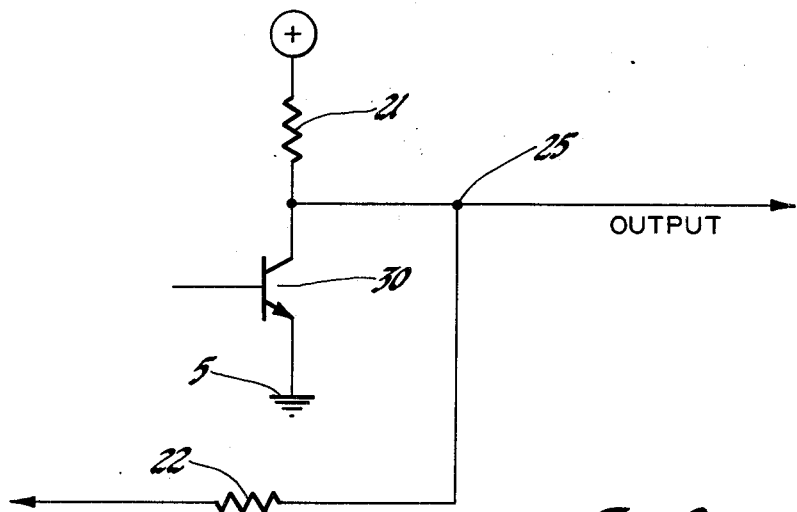

For a better understanding of the present invention, together with additional objects, advantages and features thereof, reference is made to the following description and accompanying drawing in which:

FIG. 1 sets forth one embodiment of the circuit of this invention partially in schematic and partially in block form; and FIG. 2 is a schematic representation of the output circuit stage of the voltage comparator circuit of FIG. 1.

As point of reference or ground potential is the same point electrically throughout the system, it is illustrated in the drawing by the accepted schematic symbol and is referenced by the numeral 5.

A conventional voltage comparator circuit having inverting and non-inverting input terminals, an output terminal and being of the type triggerable between first and second operating conditions may be employed to practice this invention. As voltage comparator circuits of this type are commercially available items well known in the art and since the voltage comparator circuit, per se, forms no parts of this invention, it is illustrated in block form in the drawing. In an actual embodiment, the voltage comparator circuit employed is a commercially available device marketed by the National Semiconductor Corporation under the designation LM339. Furthermore, this device is only an example of a circuit element suitable for use with the circuit of this invention, consequently, there is no intention or inference of a limitation thereto as other circuits having similar electrical characteristics may be substituted therefore without departing from the spirit of the invention.

Referring to FIG. 1 of the drawing, operating potential may be supplied by a conventional automotive type storage battery 3 having the negative polarity output terminal thereof connected to point of reference or ground potential 5 and the positive polarity output terminal thereof connected to a positive polarity potential lead 6.

In an actual embodiment, the circuit of this invention is used with a conventional automotive type magnetic pickup distributor, which may be any of the several distributors of this type well known in the automotive art, for the purpose of producing substantially square wave output signals having the edges thereof synchronized with the polarity transitions of the series of alternating current input signals which is the series of alternating current signals produced by the magnetic pickup distributor in timed relationship with an internal combustion engine 8. One example of a magnetic distributor well known in the automotive art suitable for use with the circuit of this invention is of the variable reluctance type disclosed and described in U.S. Pat. No. 3,254,247, Falge, which issued May 31, 1966 and is assigned to the same assignee as is this application. In the interest of reducing drawing complexity, the variable reluctance type ignition distributor disclosed and described in the aforementioned patent is set forth is schematic form in the drawing. A rotor member 11 is rotated in timed relationship with and by engine 8 in a manner well known in the automotive art within the bore of pole piece 12. Equally spaced about the outer periphery of rotor member 11 and about the bore of pole piece 12 are a series of projections equal in number to the number of cylinders of the engine 8 with which the distributor is being used. Pole piece 12 may be made up of a stack of a plurality of laminations of magnetic material secured in stacked relationship by rivets or bolts or other fastening methods and a magnetic flux may be provided by a permanent magnet, not shown, which may be secured to the lower face surface thereof. As each projection of rotor member 11 approaches a projection on pole piece 12, the reluctance of the magnetic circuit between rotor member 11 and pole piece 12 decreases and as each projection on rotor member 11 moves away from the projection on pole piece 12, the reluctance of the magnetic circuit between rotor member 11 and pole piece 12 increases. Consequently, the magnetic field produced by the permanent magnet increases and decreases as each projection on rotor member 11 approaches and passes a projection on pole piece 12. As rotor member 11 is rotated by engine 8, therefore, a series of alternating current signals is induced in pickup coil 10, magnetically coupled to pole piece 12, of a wave form as shown in FIG. 1 above the rotor, pole piece and pickup coil assembly. Terminal end 10a of a pickup coil 10 is connected to the inverting input terminal of voltage comparator circuit 20 and terminal end 10b thereof is connected through series bias resistor 15 to the non-inverting input terminal of voltage comparator circuit 20. Pickup coil 10, therefore, is the source of the series of alternating current input signals.

A resistor 16 is connected across positive polarity potential lead 6 and junction 17 between terminal end 10b of pickup coil 10 and series bias resistor 15 and a resistor 18 is connected across junction 17 and point of reference or ground potential 5. A pull-up resistor 21 is connected across positive polarity potential lead 6 and output terminal 25 of voltage comparator circuit 20 and another resistor 22 is connected across output terminal 25 of voltage comparator circuit 20 and junction 23 between series bias resistor 15 and the non-inverting input terminal of comparator circuit 20.

In FIG. 2 wherein elements corresponding to the same elements of FIG. 1 are assigned like characters of reference, the output circuit stage of comparator circuit 20 is illustrated in schematic form. Output terminal 25 of comparator circuit 20 is the uncommitted collector electrode of a grounded emitter NPN transistor 30. With an input signal applied to the inverting input terminal of voltage comparator circuit 20 of a positive polarity potential level greater than that applied to the non-inverting input terminal, NPN output transistor 30 is conductive, consequently, a substantially ground signal is present upon output terminal 25 and with an input signal applied to the non-inverting input terminal of voltage comparator circuit 20 of a positive polarity potential level greater than that applied to the inverting input terminal, NPN output transistor 30 is not conductive, consequently, a direct current potential signal of a positive polarity and of a level substantially equal to that of battery 3 is present upon output terminal 25.

Capacitors 31 and 32 provide a high frequency transient bypass network and Zener diode 33 clamps the input alternating current signal to a safe level.

Over those half cycles of the series of alternating current input signals during which terminal end 10b of pickup coil 10 is of a positive polarity with respect to terminal end 10a, the NPN output transistor 30 of voltage comparator circuit 20 is not conductive. With this NPN output transistor not conducting, a potential signal of a positive polarity with respect to point of reference or ground potential 5 and of a level substantially equal to that of battery 3 is present upon output terminal 25 of voltage comparator circuit 20. During this condition of operation of voltage comparator circuit 20, a circuit through which current flow is directed through bias resistor 15 in a first direction from junction 23 toward junction 17 is established and may be traced from the positive polarity terminal of battery 3, through positive polarity potential lead 6, pull-up resistor 21, output terminal 25 of voltage comparator circuit 20, resistor 22, bias resistor 15 from junction 23 toward junction 17, resistor 18 and point of reference or ground potential 5 to the negative polarity terminal of battery 3. With current flow in this direction, the bias potential generated across bias resistor 15 is of a positive polarity upon the terminal end thereof connected to junction 23 and of a negative polarity upon the terminal end thereof connected to junction 17. As the terminal end 10b of pickup coil 10 is of a positive polarity with respect to terminal end 10a, the bias potential developed across bias resistor 15 is in series aiding relationship with this half cycle of the alternating current input signal. Because of this series aiding relationship, the value of the instantaneous potential applied across the input terminals of voltage comparator circuit 20 is the sum of the bias potential developed across bias resistor 15 plus the instantaneous potential value of the alternating current input signal. The bias potential generated across bias resistor 15, therefore, raises the switching threshhold of voltage comparator circuit 20. While voltage comparator circuit 20 is in this condition of operation, therefore, spurious signals that may be induced in pickup coil 10 as a result of stray magnetic fields and which are of a polarity opposite that of this half cycle of the alternating current input signal and are of a level less than the value of the instantaneous potential applied across the input terminals of voltage comparator circuit 20 are rejected. As a consequence, the spurious triggering of voltage comparator circuit 20 to the other condition of operation is inhibited.

Over those half cycles of the series of alternating current input signals during which terminal end 10a of pickup coil 10 is of a positive polarity with respect to terminal end 10b, the NPN output transistor 30 of voltage comparator circuit 20 is conductive. With this NPN output transistor conducting, a substantially ground potential signal is present upon output terminal 25 of voltage comparator circuit 20. During this condition of operation of voltage comparator circuit 20, a circuit through which current flow is directed through bias resistor 15 in a second opposite direction from junction 17 toward junction 23 is established and may be traced from the positive polarity terminal of battery 3, through positive polarity potential lead 6, resistor 16, bias resistor 15 from junction 17 toward junction 23, resistor 22, the collector-emitter electrodes of conducting NPN output transistor 30 and point of reference or ground potential 5 to the negative polarity terminal of battery 3. With current flow in this direction, the bias potential generated across bias resistor 15 is of a positive polarity upon the terminal end thereof connected to junction 17 and of a negative polarity upon the terminal end thereof connected to junction 23. As terminal end 10a of pickup coil 10 is of a positive polarity with respect to terminal end 10b, the bias potential generated across bias resistor 15 is in series aiding relationship with this half cycle of the alternating current input signal. As before, because of this series aiding relationship, the value of the instantaneous potential applied across the input terminals of voltage comparator circuit 20 is the sum of the bias potential developed across bias resistor 15 plus the instantaneous potential value of the alternating current input signal. As, while voltage comparator circuit 20 is in the other condition of operation, while voltage comparator circuit 20 is in this condition of operation, therefore, spurious signals which may be induced in pickup coil 10 as a result of stray magnetic fields and which are of a polarity opposite that of this half cycle of the alternating current input signal and are of a level less than the value of the instantaneous potential applied across the input terminals of voltage comparator circuit 20 are rejected. As a consequence, the spurious triggering of voltage comparator circuit 20 to the other condition of operation is inhibited.

In this actual embodiment, resistors 15, 16, 18, 21 and 22 are so proportioned relative to each other that the bias potential developed across bias resistor 15 during both half cycles of the series of alternating current input signals is 350 millivolts.

As the series of alternating current input signals induced in pickup coil 10 is applied to the circuit of this invention, voltage comparator circuit 20 is triggered from one condition of operation to the other near each negative to positive polarity zero crossover point of the series of alternating current input signals and vice versa near each positive to negative polarity zero crossover point of the series of alternating current input signals to produce a series of substantially square wave output signals having the edges thereof synchronized with the polarity transitions of the series of alternating current input signals, as indicated by the curve of FIG. 1 adjacent output terminal 25 of voltage comparator circuit 20.

From this description, it is apparent that voltage comparator circuit 20 is triggered from a first operating condition to a second operating condition and vice versa in response to each reversal of polarity of the alternating current input signal and that a direct current bias potential of a selected level in series aiding relationship with both half cycles of the series of alternating current input signals is developed across bias resistor 15 which is connected in series with the alternating current input signals and in electrical circuit with battery 3 and voltage comparator circuit 20 in such a manner that current flow therethrough is in respective first and second opposite directions while voltage comparator circuit 20 is in the first and in the second operating condition whereby the polarity of the bias potential developed thereacross reverses with each change of operating state of voltage comparator circuit 20.

While a preferred embodiment of the present invention has been shown and described, it will be obvious to those skilled in the art that various modifications and substitutions may be made without departing from the spirit of the invention which is to be limited only within the scope of the appended claims.

What is claimed is:

1. A circuit for producing a series of substantially square wave output signals having the edges thereof synchronized with the polarity transitions of a series of alternating current input signals comprising in combination with a unidirectional supply potential source and a source of a series of alternating current input signals: a voltage comparator circuit having output circuit means first and second input circuit means across which said alternating current input signal source is electrically connected for triggering, said voltage comparator circuit from a first operating condition to a second operating condition and vice versa in response to each reversal of polarity of said series of alternating current input signals; and means for developing a direct current bias potential of a selected level in series aiding relationship with both half cycles of said series of alternating current input signals for providing an instantaneous potential across said input circuit means of said comparator circuit that is the sum of said bias potential plus the instantaneous potential value of said alternating current input signal.

2. A circuit for producing a series of substantially square wave output signals having the edges thereof synchronized with the polarity transitions of a series of alternating current input signals comprising in combination with a unidirectional supply potential source and a source of a series of alternating current input signals: a voltage comparator circuit having output circuit means and first and second input circuit means across which said alternating current input signal source is electrically connected for triggering said voltage comparator circuit from a first operating condition to a second operating condition and vice versa in response to each reversal of polarity of said series of alternating current input signals; a resistor connected in series with said source of alternating current input signals for developing a direct current bias potential of a selected level in series aiding relationship with both half cycles of said series of alternating current input signals; and circuit means connected in electrical circuit with said supply potential source and said comparator circuit output circuit means for directing current flow through said resistor in respective first and second opposite directions while said comparator circuit is in said first and in said second operating condition to reverse the polarity of said bias potential with each change of operating condition of said comparator circuit and thereby provide an instantaneous potential across said input circuit means of said comparator circuit that is the sum of said bias potential plus the instantaneous potential value of said alternating current input signal.

3. A circuit for producing a series of substantially square wave output signals having the edges thereof synchronized with the polarity transitions of a series of alternating current input signals comprising in combination with a unidirectional supply potential source and a source of a series of alternating current input signals: a voltage comparator circuit having output circuit means and first and second input circuit means across which said alternating current input signal source is electrically connected for triggering said voltage comparator circuit from a first operating condition to a second operating condition and vice versa in response to each reversal of polarity of said series of alternating current input signals; a resistor connected in series with said source of alternating current input signals for developing a direct current bias potential of a selected level in series aiding relationship with both half cycles of said series of alternating current input signals; first circuit means including said resistor connected in electrical circuit with said supply potential source through which current is directed through said resistor in a first direction while said comparator circuit is in a selected one of said first and second operating conditions; and second circuit means including said resistor connected in electrical circuit with said supply potential source through which current is directed through said resistor in a second opposite direction while said comparator circuit is in the other one of said first and second operating conditions whereby the polarity of said bias potential reverses with each change of operating condition of said comparator circuit and the instantaneous potential applied across said input circuit means of said comparator circuit is the sum of said bias potential plus the instantaneous potential value of said alternating current input signal.

* * * * *